United States Patent [19]

Hashimoto et al.

[11] Patent Number: 4,939,535

[45] Date of Patent: Jul. 3, 1990

[54] METHOD OF CONTROLLING TRANSPORT OF PHOTORECEPTIVE SHEET

[75] Inventors: Osamu Hashimoto, Ikoma; Kunio Ohashi, Nara; Shougo Iwai, Yamatokoriyama, all of Japan

[73] Assignee: Sharp Kabushiki Kaisha, Osaka, Japan

[21] Appl. No.: 323,869

[22] Filed: Mar. 15, 1989

[30] Foreign Application Priority Data

| Mar. 16, 1988 | [JP] | Japan | 63-64426 |
| Mar. 16, 1988 | [JP] | Japan | 63-64427 |
| Mar. 17, 1988 | [JP] | Japan | 63-64901 |

[51] Int. Cl.[5] .................... G03B 27/32; G03B 27/52
[52] U.S. Cl. ........................ 355/27; 355/50; 355/77
[58] Field of Search ............ 355/77, 27, 28, 50; 430/138

[56] References Cited

U.S. PATENT DOCUMENTS

| 4,115,817 | 9/1978 | Suzuki et al. | 355/28 X |
| 4,136,946 | 1/1979 | Nishimoto | 355/28 |
| 4,260,234 | 4/1981 | Burton | 355/28 X |
| 4,596,457 | 6/1986 | Peeters et al. | 355/77 X |
| 4,624,560 | 11/1986 | Beery | 355/27 |
| 4,777,513 | 10/1988 | Nelson | 355/27 |

FOREIGN PATENT DOCUMENTS

| 2305684 | 8/1973 | Fed. Rep. of Germany . |
| 1597859 | 10/1979 | Fed. Rep. of Germany . |
| 58-88739 | 5/1983 | Japan . |
| 60-259490 | 12/1985 | Japan . |
| 61-24495 | 2/1986 | Japan . |
| 1554121 | 10/1979 | United Kingdom . |

OTHER PUBLICATIONS

7/28/89 European Search Report Form 1507, 3 pages.

Primary Examiner—Richard A. Wintercorn

[57] ABSTRACT

A method of controlling transport of a photoreceptive sheet, including the steps of: feeding the photoreceptive sheet from a roll of the photoreceptive sheet to an exposure position subjecting the photoreceptive sheet to image forming exposure and transporting the exposed photoreceptive sheet to a buffer region; transporting the photoreceptive sheet disposed at the buffer region to an image forming position; and feeding the photoreceptive sheet disposed between the exposure position to the image forming position and the image forming position.

6 Claims, 19 Drawing Sheets

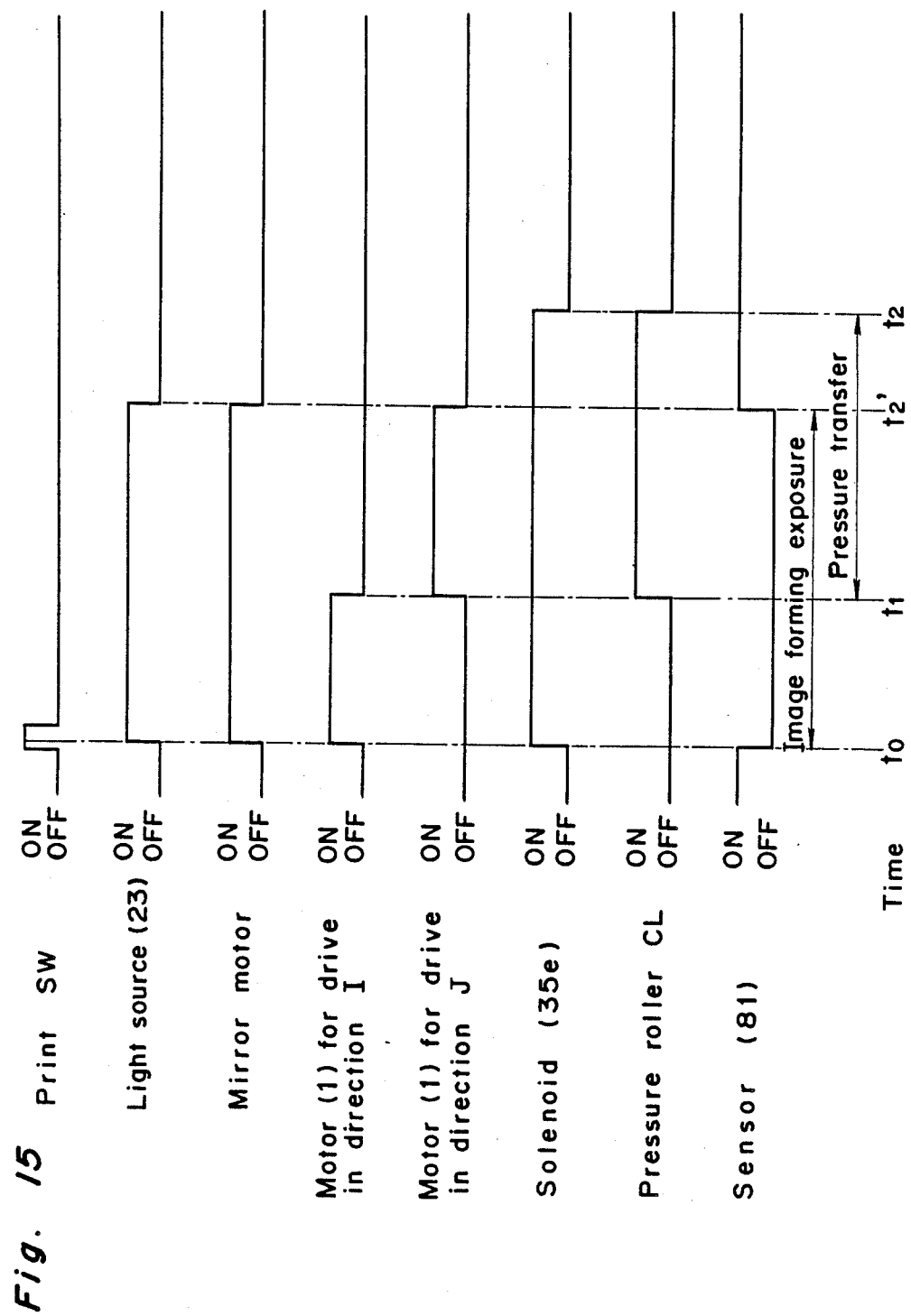

METHOD OF CONTROLLING TRANSPORT OF PHOTORECEPTIVE SHEET

BACKGROUND OF THE INVENTION

The present invention generally relates to an image forming apparatus employing a photoreceptive sheet and an image receiving sheet and more particularly, to a method of controlling transport of the photoreceptive sheet to an image forming exposure position and an image forming position.

An image forming method employing an image forming sheet is disclosed in, for example, in Japanese Patent Laid-Open Publication No. 88739/1983 which employs not only a photoreceptive sheet coated with photosensitive resinous microcapsules containing colorless dye and photo-setting material but an image receiving sheet coated with developing material for effecting color development of the colorless dye. In this known image forming method, a selectively set image has been formed on the photoreceptive sheet by image forming exposure, the image receiving sheet is placed on the photoreceptive sheet so as to be pressed against the photoreceptive sheet such that unset photosensitive microcapsules are ruptured. Thus, the colorless dye contained in the photosensitive microcapsules is subjected to color development on the image receiving sheet to obtain an image.

Therefore, in an image forming apparatus based on such a known image forming method, the photoreceptive sheet is transported through an exposure position for performing image forming exposure and an image forming position for pressing the photoreceptive sheet, while the image receiving sheet is transported through the image forming position. Hence, the image receiving sheet is placed on the photoreceptive sheet having the selectively set image formed thereon by image forming exposure at the exposure position so as to be pressed against the photoreceptive sheet at the image forming position.

In order to obtain an excellent image on the image receiving sheet, the photosensitive microcapsules of an exposed portion of the photoreceptive sheet should be set sufficiently and complete reaction between the colorless dye and the developing material should take place on the image receiving sheet. The rate of photo-setting reaction of the photosensitive microcapsules is different from the rate of color development reaction of the colorless dye on the image receiving sheet. Therefore, in order to obtain a proper image, not only is feed rate of the photoreceptive sheet at the exposure position required to coincide with an optimum exposure speed for effecting photo-setting reaction of the photosensitive microcapsules but the feed rate of the photoreceptive sheet at the image forming position is required to coincide with an optimum image forming speed for effecting color development reaction of the colorless dye.

However, in the above described prior art image forming apparatus, a pressing device for pressing the photoreceptive sheet and the image receiving sheet against each other is constituted by a pair of rollers such that the photoreceptive sheet is transported through rotation of the rollers. Therefore, the transport speed of the photoreceptive sheet coincides with the peripheral speed of the rollers and thus, the feed rate of the photoreceptive sheet at the exposure position is identical with the feed rate of the photoreceptive sheet at the image forming position. Consequently, it becomes impossible to set either one or both feed rates of the photoreceptive sheet at the exposure position and the image forming position to the optimum speed or the optimum speeds, thereby resulting in deterioration of the formed image.

SUMMARY OF THE INVENTION

Accordingly, an essential object of the present invention is to provide a method of controlling transport of a photoreceptive sheet, in which the feed rate of the photoreceptive sheet at an exposure position and the feed rate of the photoreceptive sheet at an image forming position can be separately set and controlled such that an excellent image is obtained.

In order to accomplish this object of the present invention, a method of controlling transport of a photoreceptive sheet, embodying the present invention comprises the steps of: feeding the photoreceptive sheet from a roll of the photoreceptive sheet to an exposure position so as to subject the photoreceptive sheet to image forming exposure and transporting the exposed photoreceptive sheet to a buffer region; transporting the photoreceptive sheet disposed at the buffer region to an image forming position; and feeding the photoreceptive sheet disposed between the exposure position and the image forming position to the image forming position.

In accordance with this method of the present invention, since the photoreceptive sheet is merely exposed at the first step, the feed rate of the photoreceptive sheet can be set to an optimum exposure speed and thus, image forming exposure of the photoreceptive sheet is performed properly. Meanwhile, in the second and third steps, since the photoreceptive sheet has been already exposed and is merely fed through the image forming position, the feed rate of the photoreceptive sheet can be set to an optimum image forming speed and therefore, an excellent image is formed.

Furthermore, a method of controlling transport of a photoreceptive sheet, according to the present invention comprises the steps of: feeding the photoreceptive sheet from a roll of the photoreceptive sheet to an exposure position so as to subject the photoreceptive sheet to image forming exposure and transporting the exposed photoreceptive sheet transporting to the buffer region, the photoreceptive sheet disposed at the exposure position to the buffer region; and transporting the photoreceptive sheet disposed at the buffer region to an image forming position.

In accordance with this method of the present invention, the feed rate of the photoreceptive sheet can be set to an optimum exposure speed and thus, image forming exposure of the photoreceptive sheet is properly performed. At the second step, since the feed rate of the photoreceptive sheet can be set to an optimum image forming speed, an excellent image is obtained.

Moreover, in the method of the present invention, when the photoreceptive sheet disposed at the buffer region is transported to the image forming position, a supply shaft for the roll of the photoreceptive sheet is locked. By this measure, when the photoreceptive sheet disposed at the buffer region is transported to the image forming position, feed of the roll of the photoreceptive sheet is prevented and thus, only the photoreceptive sheet disposed at the buffer region is transported to the image forming position.

BRIEF DESCRIPTION OF THE DRAWINGS

This object and features of the present invention will become apparent from the following description taken in conjunction with the preferred embodiments thereof with reference to the accompanying drawings, in which:

FIG. 15 is a timing chart similar to FIG. 11, particularly showing the third embodiment of the present invention.

Before the description of the present invention proceeds, it is to be noted that like parts are designated by like reference numerals throughout several views of the accompanying drawings.

DETAILED DESCRIPTION OF THE INVENTION

Figure 3:
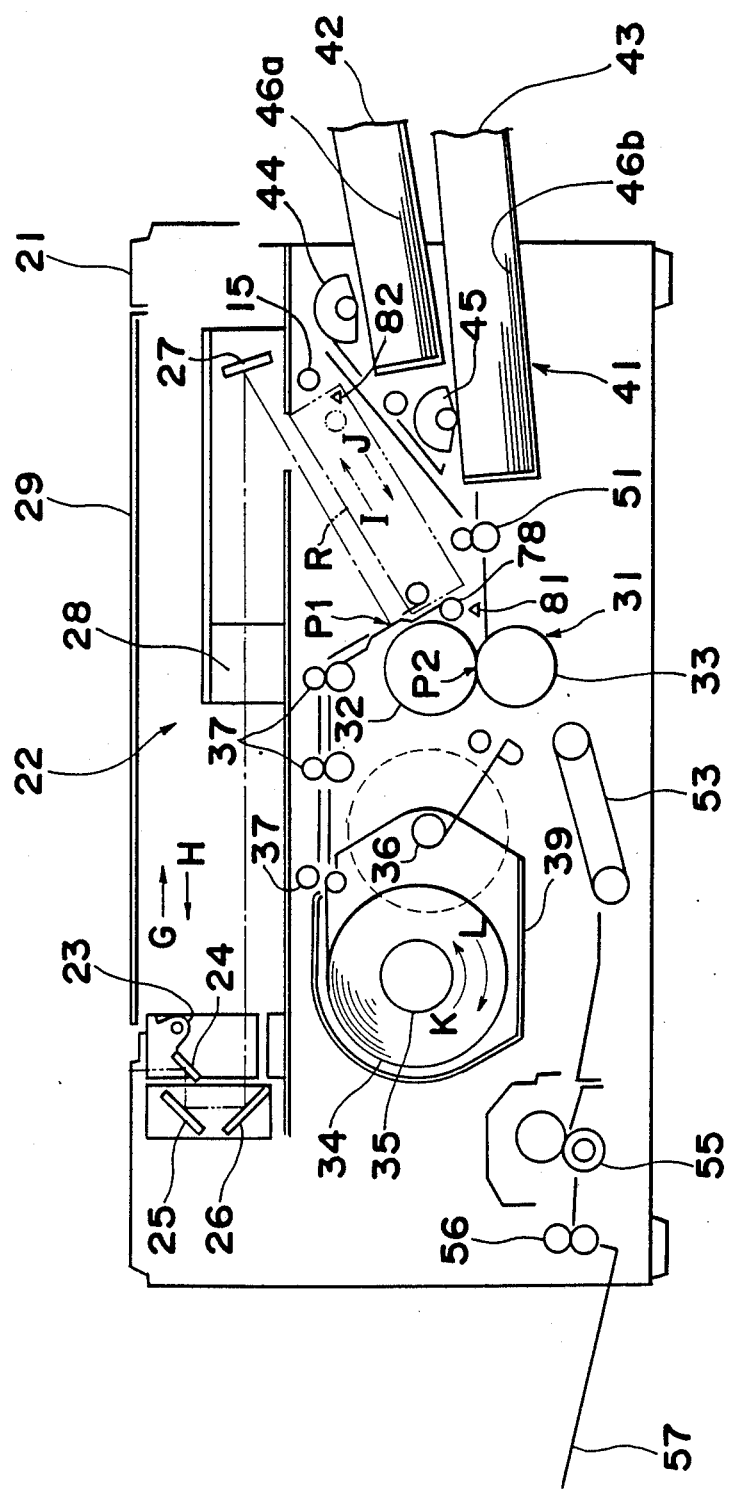
FIG. 3 is a schematic sectional view of an image forming apparatus to which the method of FIGS. 1a and 1b may be applied.

Referring now to the drawings, there is shown in FIG. 3, an image forming apparatus to which a method of controlling transport of a photoreceptive sheet 34, according to a first embodiment of the present invention may be applied. The image forming apparatus includes an apparatus housing 21. An original platform 29 made of hard glass having light transmission properties is provided on an upper face of the apparatus housing 21. An optical system 22 is constituted by a light source 23, mirrors 24 to 27 and a lens 28 and is disposed below the original platform 29. In the optical system 22, the light source 22 and the mirrors 24 to 26 are movable below the original platform 29 in the directions of the arrows G and H so as to scan an original document placed on the original platform 29.

At a central portion in the apparatus housing 21, upper and lower pressure rollers 32 and 33 are provided in pressing contact with each other so as to constitute a pressing portion 31. A point of contact between the upper and lower pressure rollers 32 and 33 is an image forming position P2 of the present invention. At the left side of the upper pressure roller 32, a sheet storage portion 39 for accommodating the photoreceptive sheet 34 is provided. The sheet storage portion 39 includes a supply shaft 35 and a take-up shaft 36. The photoreceptive sheet 34 is wound around the supply shaft 35 so as to form a roll of the photoreceptive sheet 34. The photoreceptive sheet 34 is obtained by coating on a substrate made of polyester or the like, photosensitive microcapsules containing colorless dye and photo-setting material. At a distal end portion of the photoreceptive sheet 34, which extends over a predetermined distance from the distal end of the photoreceptive sheet 34, photosensitive microcapsules are not coated on the substrate and the substrate has a rigidity larger than that of the remaining portion of the photoreceptive sheet 34 such that the distal end portion of the photoreceptive sheet 34 acts as a leader portion at the time of initial loading of the photoreceptive sheet 34 to the image forming apparatus. The photoreceptive sheet 34 is wound around an outer periphery of the take-up shaft 36 through a plurality of rollers 37, a suspended roller 78 and the image forming position P2 between the upper and lower pressure rollers 32 and 33. As will be described later, a lock mechanism for locking the supply shaft 35 which locks the supply shaft 35 at a necessary time so as to stop supply of the photoreceptive sheet 34.

Figure 6:
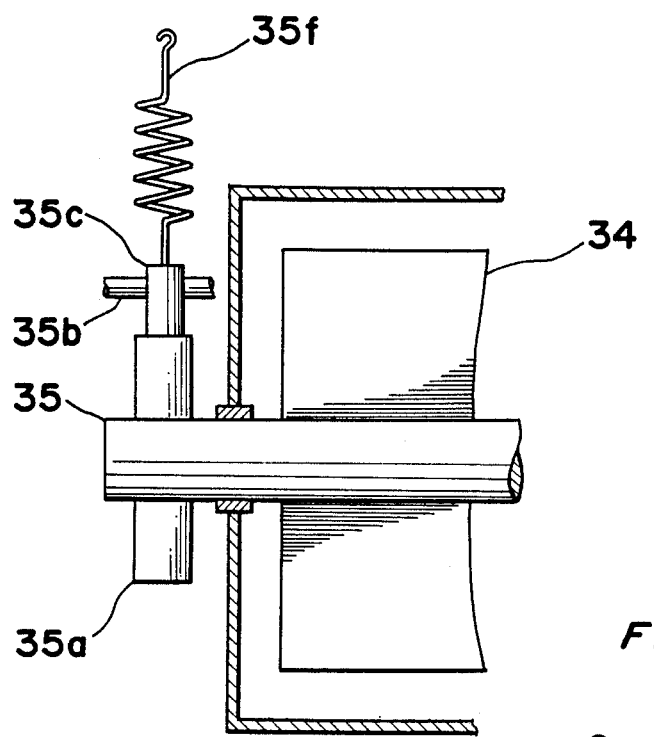
FIGS. 6 and 7 are a side elevational view and a front elevational view of a lock mechanism for locking a supply shaft employed in the image forming apparatus of FIG. 3, respectively.
Figure 7:
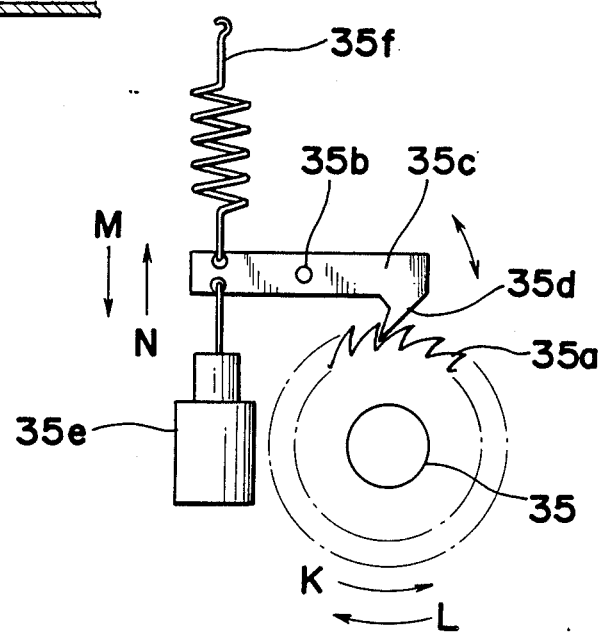

FIGS. 6 and 7 show the lock mechanism for locking the supply shaft 35. It is to be noted that FIG. 7 is viewed in a direction identical with that of FIG. 3. A gear 35a having a saw-toothed peripheral surface is fixedly mounted on one end of the supply shaft 35 having the photoreceptive sheet 34 wound therearound. Above the gear 35a, an actuator piece 35c having an engageable portion 35d formed at its one distal end portion is pivotally provided so as to be pivoted about a support shaft 35b. A solenoid 35e and a spring 35f are attached to the other end of the actuator piece 35c remote from the engageable portion 35d so as to apply opposite urging forces to the actuator piece 35c, respectively. Namely, in an ON state of the solenoid 35e, the solenoid 35e pulls the actuator piece 35c in the direction of the arrow M against the tensile force of the spring 35f so as to pivot the actuator piece 35c in the direction of the arrow M such that the engageable portion 35d is disengaged from the gear 35a. On the other hand, in an OFF state of the solenoid 35e, the spring 35f pulls the actuator piece 35c in the direction of the arrow N so as to engage the engageable portion 35d with the gear 35a. Therefore, upon energization of the solenoid 35e, the gear 35a, namely, the supply shaft 35 becomes rotatable in both directions of the arrows K and L, so that supply of the photoreceptive sheet 34 can be performed. On the contrary, upon deenergization of the solenoid 35e, the supply shaft 35 can be rotated only in the direction of the arrow K such that feed of the photoreceptive sheet 34 from the supply shaft 35 is locked. When a power source of the image forming apparatus is in the OFF state, the solenoid 35e is also an in OFF state, so that the supply shaft 35 is locked and thus, slack is not formed on the photoreceptive sheet 34.

A cassette 42 for accommodating image receiving sheets 46a and a cassette 43 for accommodating image receiving sheets 46b are loaded into a right side portion of the apparatus housing 21, while paper feeding rollers 44 and 45 are, respectively, provided above the cassettes 42 and 43. The cassettes 42 and 43 and the paper feeding rollers 44 and 45 constitute a paper feeding portion 41. Developing material for effecting color development of the colorless dye is contained in the photosensitive microcapsules, thermoplastic and for imparting gloss to a formed image is coated on the surface of each of the image receiving sheets 46a and 46b accommodated in the cassettes 42 and 43, respectively. Upon rotation of the paper feeding roller 44 or 45, the image receiving sheets 46a of the cassette 42 or the image receiving sheets 46b of the cassette 43 are fed one sheet at a time from an uppermost one of the image receiving sheets 46a or 46b. Then, the image receiving sheet 46a or 46b is carried to the image forming position P2 of the pressing portion 31 through timing rollers 51. At the image forming position P2, the image receiving sheet 46a or 46b is placed on the photoreceptive sheet 34 having a selectively set image formed thereon so as to be pressed against the photoreceptive sheet 34. The image receiving sheet 46a or 46b having passed through the image forming position P2 is drawn to a heat roller 55 by a transport belt 53 so as to be heated by the heat roller 55. By this heating, not only is reaction of color development of the colorless dye promoted as disclosed in, for example, Japanese Patent Laid-Open Publication No. 24495/1986 but the above described thermoplastic is set in a softened or molten state so as to impart gloss to the image as disclosed in, for example, Japanese Patent Laid-Open Publication No. 259490/1985. The image receiving sheet 46a or 46b having passed through the heat roller 55 is discharged onto a copy receiving tray 57 by a pair of discharge rollers 56.

As shown by the one-dot chain line in FIG. 3, the image of the original document scanned by the optical system 22 is conveyed to an exposure position P1 via the mirrors 24 to 27 and the lens 28. Before the photoreceptive sheet 34 reaches the image forming position P2, the photoreceptive sheet 34 receives, at the exposure position P1, reflected light from the original document such that a selectively set image is formed on the surface of the photoreceptive sheet 34. A suspended roller 78 is movably provided between the exposure position P1 and the image forming position P2 so as to be moved in the direction of the arrows I and J. The photoreceptive sheet 34 having passed through the exposure position P1 is transported to the image forming position P2 of the pressing portion 31 through the suspended roller 78. Meanwhile, a buffer region R of the present invention is provided at an upwardly and obliquely right location of the exposure position P1. When the suspended roller 78 having the photoreceptive sheet 34 folded therearound is displaced in the direction of the arrow I, the exposed photoreceptive sheet 34 is carried to the buffer region R.

Figure 4:
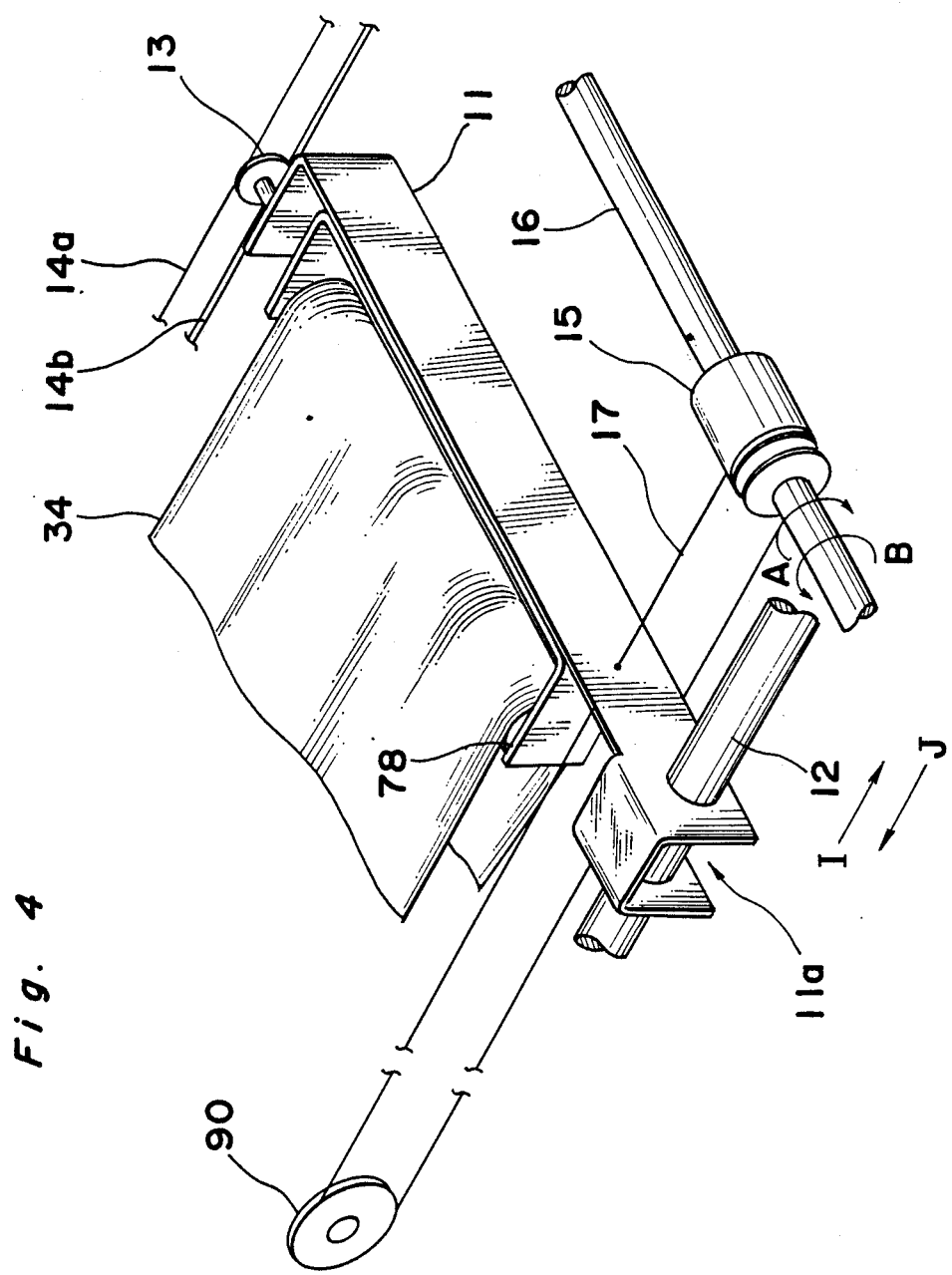
FIG. 4 is a perspective view showing the vicinity of a suspended roller employed in the image forming apparatus of FIG. 3.
Figure 5:
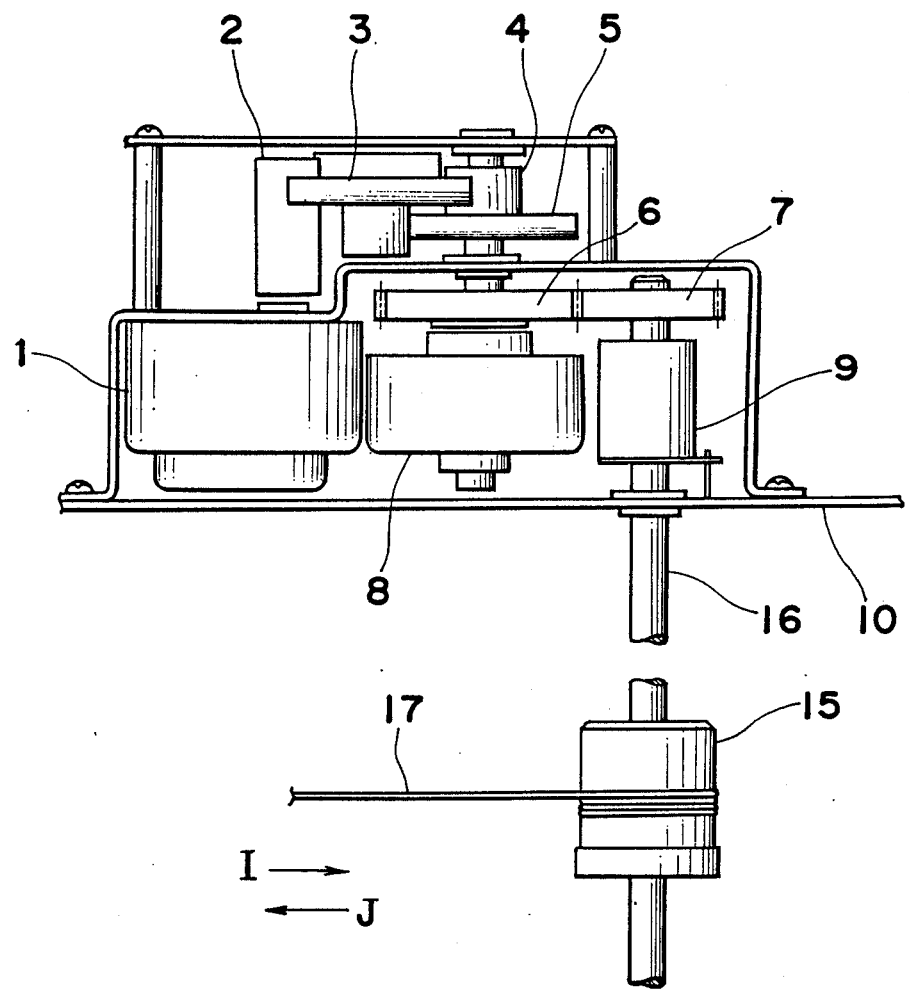
FIG. 5 is a top plan view of a drive mechanism for driving the suspended roller of FIG. 4.

FIG. 4 shows the vicinity of the suspended roller 78, while FIG. 5 shows a drive mechanism for driving the suspended roller 78. In FIG. 4, the suspended roller 78 is supported by a guide 11. A bearing portion 11a is formed at one end portion of the guide 11. A support rod 12 secured to the apparatus housing 21 is fitted into the bearing portion 11a such that the bearing portion 11a is moved along the support rod 12 in the direction of the arrows I and J of FIG. 3. Meanwhile, a roller 13 is provided at the other end of the guide 11 so as to rotate between a pair of rails 14a and 14b. One end of a wire 17 is attached to an intermediate portion of one wall face of the guide 11. The wire 17 is trained over a roller 15 secured to a shaft 16. The other end of the wire 17 is attached to the other wall face of the guide 11 through a pulley 90 disposed at one side of the upper pressure roller 32. Meanwhile, it can also be so arranged that by eliminating the pulley 90, the other end of the wire 17 is fixed to the roller 15 such that the wire 17 is wound around the roller 15.

In FIG. 5, the shaft 16 is supported by a frame 10 of the apparatus housing 21 such that rotation of a motor 1 is transmitted to the shaft 16 through gears 2 to 7, an electromagnetic clutch 8 and a torque limiter 9. When voltage has been applied to the electromagnetic clutch 8, the electromagnetic clutch 8 is brought into engagement with the gear 6 so as to transmit rotation of the motor 1 to the gear 7. The shaft 16 is rotated in the direction of the arrow A in FIG. 4 by the motor 1. The torque limiter 9 incorporates a one-way clutch so as to regulate rotational speed of the shaft 16 to not more than a predetermined value during rotation of the shaft 16 in the direction of the arrow B in FIG. 4.

By the above described arrangement, when the motor 1 is rotated and the electromagnetic clutch 8 is actuated, rotation of the motor 1 is transmitted to the shaft 16 through the gears 2 to 7 so as to rotate the shaft 16 in the direction of the arrow A in FIG. 4. Upon rotation of the shaft 16, the roller 15 is also rotated in the direction of the arrow A so as to pull the guide 11 and the suspended roller 78 in the direction of the arrow I. Hence, the photoreceptive sheet 34 folded around the suspended roller 78 is carried to the buffer region R. Feed rate of the suspended roller 78 in the direction of the arrow I can be set by rotational speed of the shaft 16 driven by the motor 1. Therefore, speed of exposure of the photoreceptive sheet 34 at the exposure position P1 can be set to an optimum value by controlling rotational speed of the motor 1.

When actuation of the electromagnetic clutch 8 is stopped, a force for displacing the suspended roller 78 together with the guide 11 in the direction of the arrow I is not produced and thus, the suspended roller 78 and the guide 11 are pulled by the photoreceptive sheet 34 so as to be displaced in the direction of the arrow J. At this time, the shaft 16 is rotated in the direction of the arrow B but is subjected to tension of the torque limiter 9, so that rotational speed of the shaft 16 does not become excessively high or the photoreceptive sheet 34 is not slackened between the suspended roller 78 and the image forming position P2.

In FIG. 3, a home position sensor 81 and a stroke limit sensor 82 are, respectively, provided at a home position of the suspended roller 78 and a stroke limit of the suspended roller 78, respectively so as to detect a position of the suspended roller 78.

Figure 8:
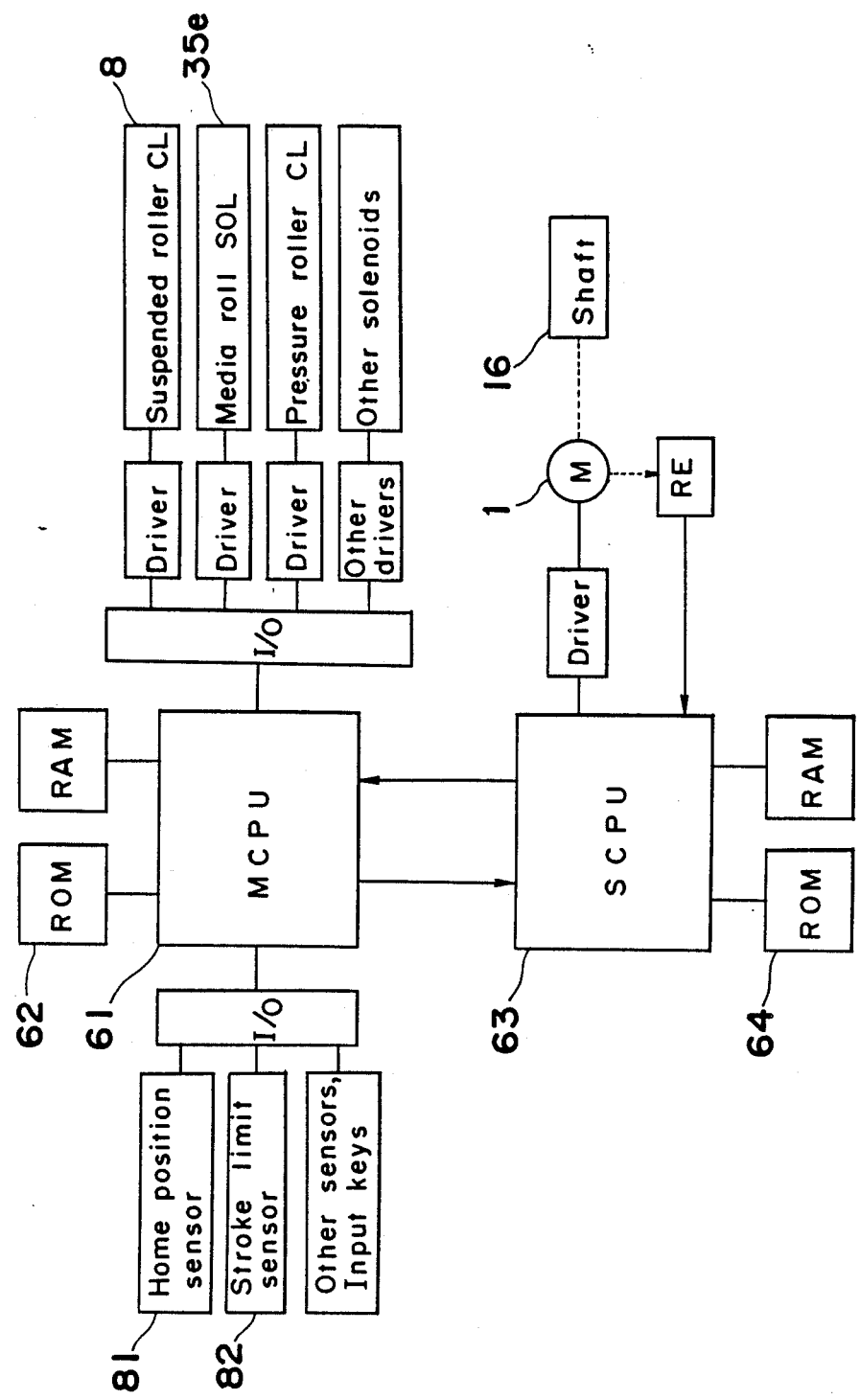
FIG. 8 is a block diagram of a control portion of the image forming apparatus of FIG. 3.

FIG. 8 is a block diagram showing a control portion of the image forming apparatus of FIG. 3. The image forming apparatus as a whole is controlled by a main central processing unit (MCPU) 61 whose processing program is stored in a read-only memory (ROM) 62. In accordance with data from the home position sensor 81, the stroke limit sensor 82, other sensors and input keys, the MCPU 61 outputs control signals to the electromagnetic clutch 8 of the drive mechanism for the suspended roller 78, the solenoid 35e for the roll of the photoreceptive sheet 34, the clutch for the upper pressure roller 32 and other solenoids. The MCPU 61 gives control commands to a subordinate central processing unit (SCPU) 63 for controlling the motor 1 of the drive mechanism for the suspended roller 78. In response to the control commands from the MCPU 61, the SCPU 63 controls the motor 1 on the basis of a processing program stored in a ROM 64.

Figure 1A:
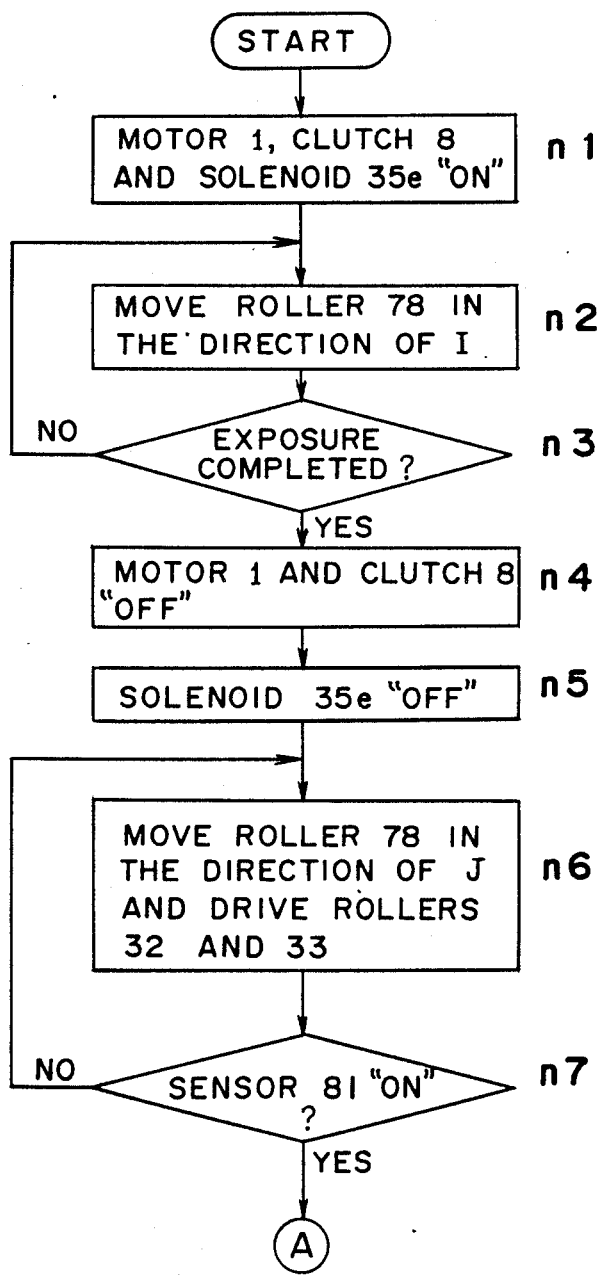
FIGS. 1a and 1b are flow charts showing a processing sequence of a method of controlling transport of a photoreceptive sheet, according to a first embodiment of the present invention.
Figure 1B:
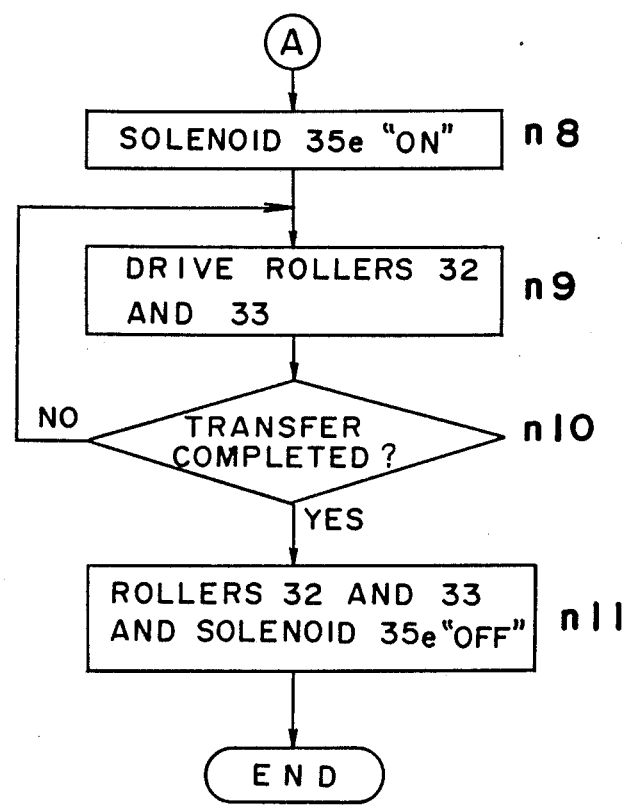

Hereinbelow, a processing sequence of the suspended roller 78 and the upper and lower pressure rollers 32 and 33 at the time when a copying operation of the image forming apparatus of FIG. 3 is performed in the method according to the first embodiment of the present invention is described with reference to flow charts of FIGS. 1a and 1b. If input of data such as size of an image to be formed and operation of a print start switch have been performed on an operating panel (not shown) on the apparatus housing 21, the program flow starts. At step n1, the motor 1 of the drive mechanism for the suspended roller 78, the clutch 8 and the solenoid 35e for the supply shaft 35 are turned on so as to cancel locking of the supply shaft 35. At the same time, the suspended roller 78 is displaced in the direction of the arrow I so as to draw the photoreceptive sheet 34 from the supply shaft 35. The photoreceptive sheet 34 drawn from the supply shaft 35 is subjected to exposure at the exposure position P1 by reflected light introduced from the original document by the optical system 22 such that a selectively set image is formed on the photoreceptive sheet 34. The exposed photoreceptive sheet 34 is carried to the buffer region R through displacement of the suspended roller 78 in the direction of the arrow I. At steps n2 and n3, until the photoreceptive sheet 34 is drawn from the supply shaft 35 through the size of the image to be formed and exposure of the drawn portion of the photoreceptive sheet 34 is completed, displacement of the suspended roller 78 in the direction of the arrow I is continued. After completion of exposure, the motor 1 and the clutch 8 are turned off so as to stop draw of the photoreceptive sheet 34 from the supply shaft 35 at step n4. At this time, the rear end of the selectively set image is disposed at the exposure position P1.

Subsequently, at step n5, the solenoid 35e for the supply shaft 35 is turned off so as to prevent the supply shaft 35 from rotating in the direction of the arrow L and thus, the photoreceptive sheet 34 cannot be drawn from the supply shaft 35. Then, at step n6, the clutch for the upper pressure roller 32 is turned on so as to rotate the upper and lower pressure rollers 32 and 33 by a drive unit (not shown) and the suspended roller 78 is pulled by the photoreceptive sheet 34 so as to be carried in the direction of the arrow J. Thus, the photoreceptive sheet 34 disposed at the buffer region R is transported to the image forming position P2 between the upper and lower pressure rollers 32 and 33 and thus, the image receiving sheet 46a or 46b is placed on the photoreceptive sheet 34 so as to be pressed against the photoreceptive sheet 34. Thus, unset photosensitive microcapsules of the photoreceptive sheet 34 are ruptured and color development of colorless dye flowing out of the ruptured photosensitive microcapsules is performed by developing material of the image receiving sheet 46a or 46b such that an image is formed on the image receiving sheet 46a or 46b.

Meanwhile, in this embodiment, feed of the photoreceptive sheet 34 from the roll of the photoreceptive sheet 34 is positively prevented by locking the supply shaft 35. However, it can also be so arranged that load of the supply shaft 35 is adjusted, thereby eliminating the need for provision of the lock mechanism for locking the supply shaft 35. Displacement of the suspended roller 78 in the direction of the arrow J is continued until the home position sensor 81 is turned on at step n7.

Then, at step n8, the solenoid 35e for the supply shaft 35 is turned on so as to cancel locking of the supply shaft 35. Subsequently, at step n9, the photoreceptive sheet 34 is drawn from the supply shaft 35 upon rotation of the upper and lower pressure rollers 32 and 33 and the image receiving sheet 46a or 46b is placed on the photoreceptive sheet 34 so as to be pressed against the photoreceptive sheet 34. Draw of the photoreceptive sheet 34 from the supply shaft 35 is performed until at least the rear end of the selectively set image on the photoreceptive sheet 34 passes through the image forming position P2 at step n10. When pressing of the photoreceptive sheet 34 against the image receiving sheet 46a or 46b has been completed, the clutch for driving the upper pressure roller 32 is turned off so as to stop rotation of the upper and lower pressure rollers 32 and 33 and the solenoid 35e for the supply shaft 35 is turned off so as to lock the supply shaft 35 at step n11.

The image forming processing is performed as described above. Meanwhile, this processing sequence is based on the method of claim 1 of the present invention. Namely, steps n2 and n3 correspond to the first step of claim 1, steps n4, n6 and n7 correspond to the second step of claim 1 and steps n9 and n10 correspond to the third step of claim 1.

Figure 2A:
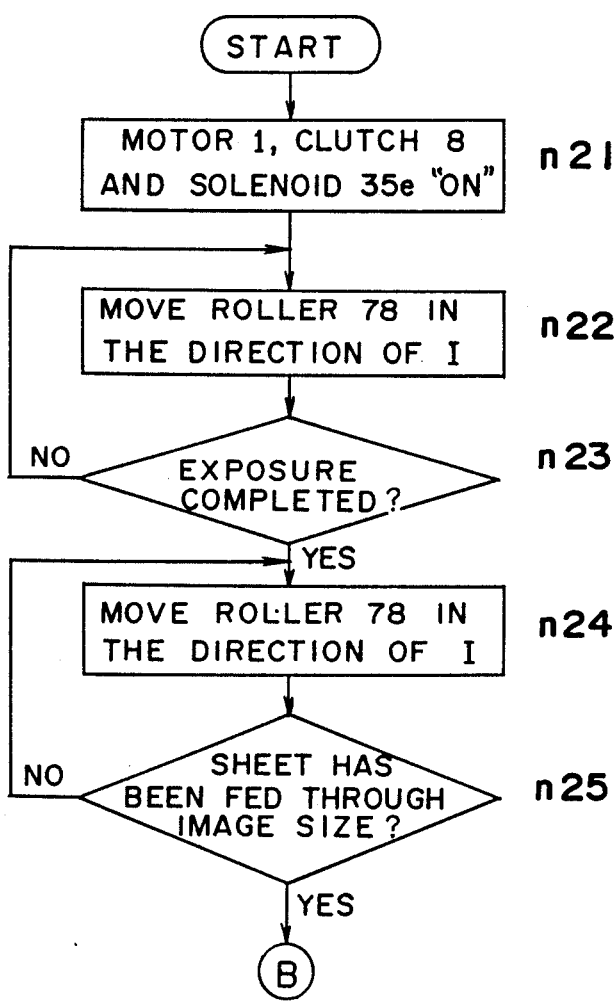
FIGS. 2a and 2b are flow charts similar to FIGS. 1a and 1b, particularly showing a modification thereof.
Figure 2B:
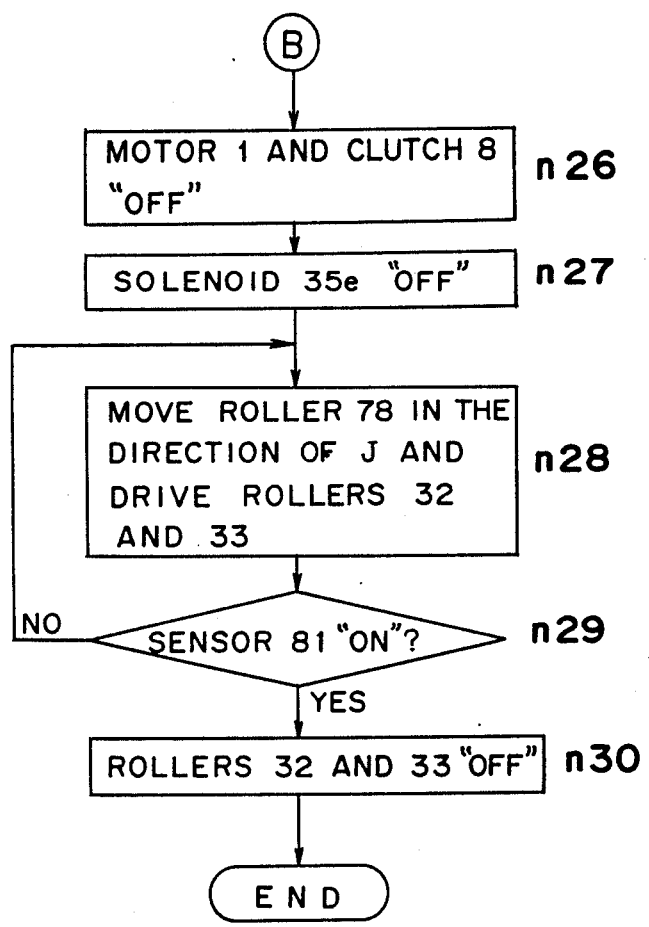

Hereinbelow, a modified processing sequence of the suspended roller 78 and the upper and lower pressure rollers 32 and 33 at the time of a copying operation in the image forming apparatus of FIG. 3 is described with reference to flow charts of FIGS. 2a and 2b. This processing sequence is based on the method of claim 2 of the present invention. Steps n21 to n23 are executed in the same manner as step n1 to n3 of FIG. 1a. However, in this modified processing sequence, even after completion of exposure, the suspended roller 78 is continuously displaced in the direction of the arrow I at step n24. If it is found at step n25 that the photoreceptive sheet 34 has been conveyed to the buffer region R through the size of the image to be formed, namely the photoreceptive sheet 34 disposed at the exposure position at the time of completion of exposure (rear end of the selectively set image) has been conveyed to the buffer region R by the suspended roller 78, the motor 1 and the clutch 8 are turned off at step n26 so as to stop the suspended roller 78. Subsequently, at step n27, the solenoid 35e for the supply shaft 35 is locked.

Then, at step n28, the clutch for the upper pressure roller 32 is actuated so as to rotate the upper and lower pressure rollers 32 and 33 and the suspended roller 78 is displaced in the direction of the arrow J by a pulling force of the photoreceptive sheet 34 such that pressure transfer is performed. Then if is found at step n29 that the home position sensor 81 has been turned on, namely pressure transfer up to the rear end of the selectively set image on the photosensitive sheet 34 has been completed, the clutch for the upper pressure roller 32 is turned off at step n30 so as to stop rotation of the upper and lower pressure rollers 32 and 33.

Meanwhile, steps n22 and n23 correspond to the first step of claim 2, steps n24 and n25 correspond to the second step of claim 2 and steps n28 and n29 correspond to the third step of claim 2. In claim 3 of the present invention, "locking of the supply shaft 35 when the photoreceptive sheet 34 disposed at the buffer region R is transported to the image forming position P2" corresponds to step n5 of FIG. 1a or step n27 of FIG. 2b.

In the method according to the first embodiment of the present invention, since feed rate of the photoreceptive sheet at the time of exposure and feed rate of the photoreceptive sheet at the time of image formation can be separately set to optimum values, respectively, an excellent image can be obtained through prevention of deterioration of image quality.

Figure 9A:
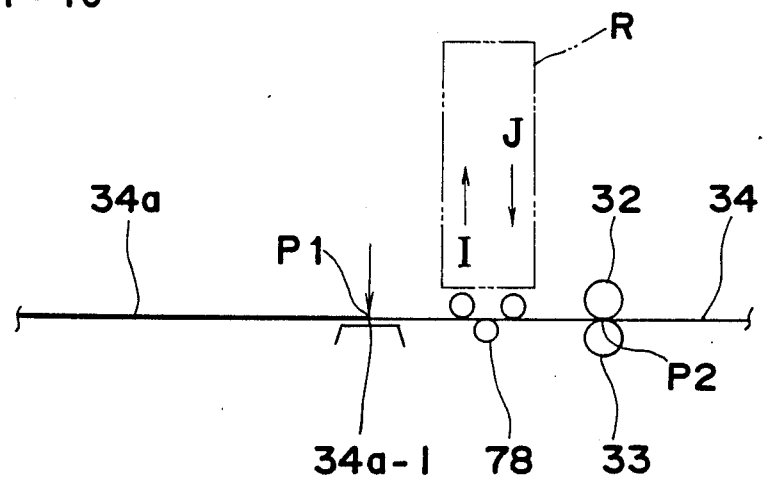
FIGS. 9a to 9d are views showing states of the photoreceptive sheet in the vicinity of an exposure position and an image forming position in a method of controlling transport of the photoreceptive sheet, according to a second embodiment of the present invention, respectively.

FIGS. 9a to 9d show transport states of the photoreceptive sheet 34 in a method of controlling transport of the photoreceptive sheet 34, according to a second embodiment of the present invention. A portion 34a of the photoreceptive sheet 34, which is shown by a bold line, is an image area in which the selectively set image is formed. The image area 34a has a front end 34a-1 and a rear end 34a-2. The image area 34a is subjected to exposure at the exposure position P1 by the optical system 22. Reference numeral 46 denotes the image receiving sheet 46a or 46b of FIG. 3. At the image forming position P2, the image receiving sheet 46 is placed on the image area 34a of the photoreceptive sheet 34 so as to be pressed against the photoreceptive sheet 34 such that pressure transfer is performed. Meanwhile, at the image forming position P2, a high pressure is applied to the photoreceptive sheet 34 at all times by the upper and lower pressure rollers 32 and 33. Pressure transfer is performed upon rotation of the upper and lower pressure rollers 32 and 33 in the direction of the arrows shown in FIG. 9c. The suspended roller 78 is disposed between the exposure position P1 and the image forming position P2. In FIG. 9a, the buffer region R is disposed at one side of the photoreceptive sheet 34 remote from the suspended roller 78. Upon displacement of the suspended roller 78 in the direction of the arrow I, the photoreceptive sheet 34 is folded around the suspended roller 78 so as to be carried to the buffer region R. On the other hand, upon displacement of the suspended roller 78 in the direction of the arrow J, the photoreceptive sheet 34 disposed at the buffer region R is fed to the image forming position P2.

Figure 9B:
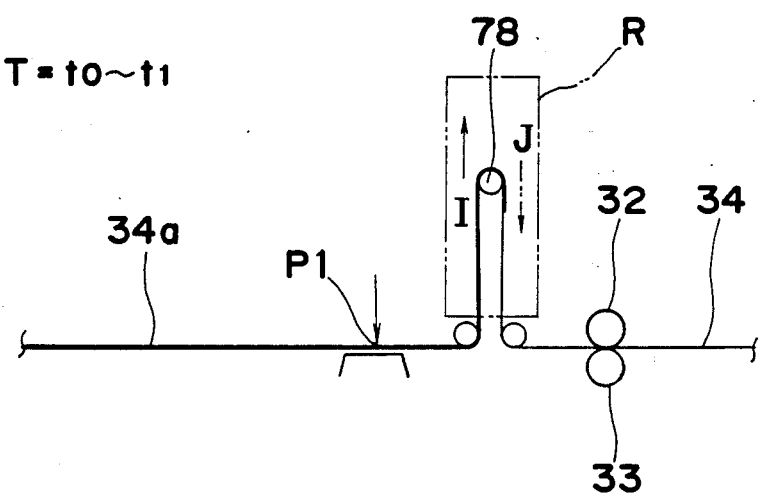

More specifically, in FIGS. 9a and 9b, the image area 34a of the photoreceptive sheet 34 is subjected to exposure at the exposure position P1 such that the selectively set image is formed on the photoreceptive sheet 34. When the suspended roller 78 is displaced in the direction of the arrow I, the photoreceptive sheet 34 is drawn from the supply shaft 35 so as to be carried to the buffer region R such that the photoreceptive sheet 34 is subjected to exposure at the exposure position P1 while being drawn from the supply shaft 35. At this time, the upper and lower pressure rollers 32 and 33 are not driven and only the exposure process is performed. Therefore, if feed rate of the suspended roller 78 in the direction of the arrow I is set to an optimum exposure speed (first speed V1), exposure can be excellently performed.

Figure 9C:
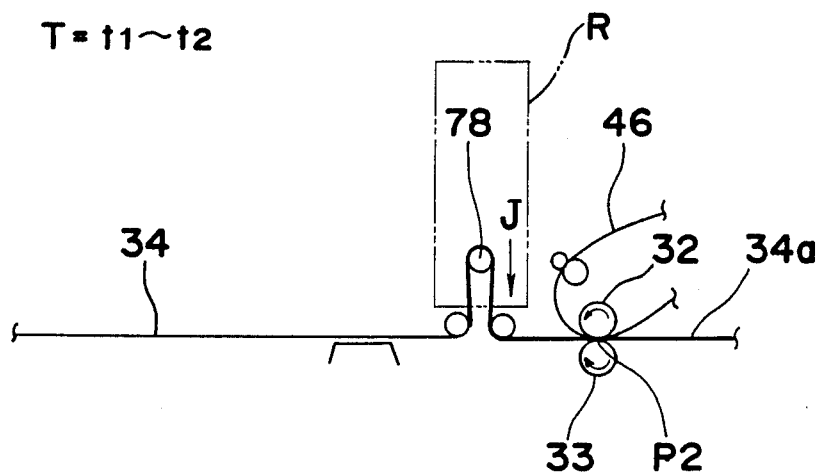

Upon lapse of a predetermined time period t1, displacement of the suspended roller 78 at feed rates corresponding to the optimum exposure speed and an optimum image forming speed (second speed V2) is started and the upper and lower pressure rollers 32 and 33 are rotated such that pressure transfer is performed simultaneously with exposure. Generally, the optimum image forming speed is higher than the optimum exposure speed. The suspended roller 78 is displaced in the direction of the arrow J at the second speed V2. FIG. 9c shows a state in which the suspended roller 78 is being displaced in the direction of the arrow J. In FIG. 9c, upon rotation of the upper and lower pressure rollers 32 and 33 and displacement of the suspended roller 78, the photoreceptive sheet 34 disposed at the buffer region R is transported to the image forming position P2. At the same time, the image receiving sheet 46 is also conveyed to the image forming position P2 where the image receiving sheet 46 is placed on the image area 34a of the photoreceptive sheet 34 so as to be pressed against the image area 34a such that an image subjected to color development is formed on the image receiving sheet 46 through rupture of unset photosensitive microcapsules.

Figure 9D:
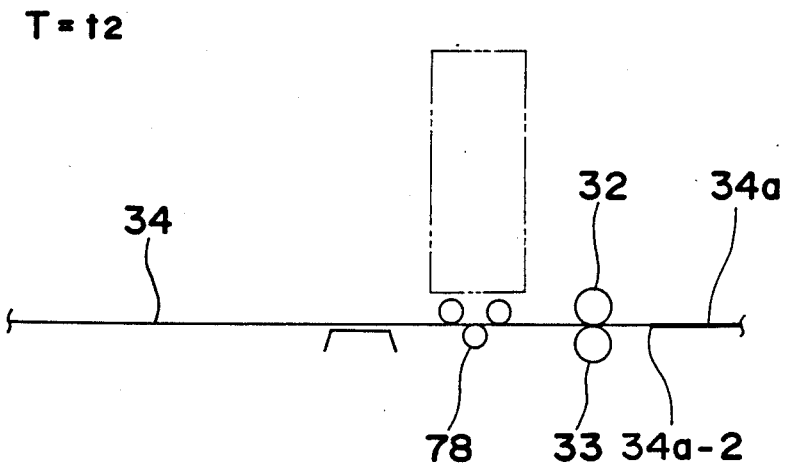

FIG. 9d shows a state in which image formation has been completed. When the suspended roller 78 has been returned to the original position (home position), the rear end 34a-2 of the image area 34a is carried to a location slightly downstream of the upper and lower pressure rollers 32 and 33. Namely, a time point for starting displacement of the suspended roller 78 performed at the second speed V2 is set such that the state of FIG. 9d is obtained when the suspended roller 78 has been returned to the home position. This is because such a phenomenon is prevented that image formation is completed in a state where the rear end of the image receiving sheet 46 is gripped between the upper and lower pressure rollers 32 and 33.

Hereinbelow, setting of the feed rates of the suspended roller 78 and the time point for starting displacement of the suspended roller 78 performed at the second speed V2 is described. As described above, character V1 denotes the optimum exposure speed (first speed) and character V2 denotes the optimum image forming speed (second speed). It is supposed here that character V3 denotes speed of the suspended roller 78 in the direction of the arrow I, character V4 denotes speed of the suspended roller 78 in the direction of the arrow J, character L denotes a length of the image area 34a, character l denotes a distance obtained by adding a length $\alpha$ of about 5-20 mm to a distance between the exposure position P1 and the image forming position P2, character t0 denotes a time point of start of exposure, character t1 denotes a time period between the time point t0 and a time point of start of pressure transfer and character t2 denotes a time period between the time point t0 and a time point of completion of pressure transfer. Meanwhile, the length $\alpha$ is provided for transporting the rear end 34a-2 of the image area 34a, i.e. the rear end of the image receiving sheet 46 to a location slightly downstream of the upper and lower pressure rollers 32 and 33 at the time of completion of image formation.

During a time period T from t0 to t1 of FIG. 9b, since the photoreceptive sheet 34 is subjected only to exposure, the suspended roller 78 is displaced in the direction of the arrow I so as to draw the photoreceptive sheet 34 from the supply shaft 35 at the first speed V1. Thus, the following relation (1) is obtained.

$$V3 = \tfrac{1}{2} V1 \tag{1}$$

Meanwhile, during a time period T from t1 to t2 of FIG. 9c, since the photoreceptive sheet 34 is not only subjected to exposure but is pressed at the image forming position P2, the suspended roller 78 is displaced in the direction of the arrow J such that the roll of the photoreceptive sheet 34 is drawn from the supply shaft 35 at the first speed V1 and the photoreceptive sheet 34 disposed at the buffer region R is fed to the image forming position P2 at the second speed V2. Hence, the following equation (2) is obtained.

$$V4 = \tfrac{1}{2}(V2 - V1) \tag{2}$$

Furthermore, since distance of travel of the suspended roller 78 in the direction of the arrow I during the time period T from t0 to t1 is identical with the distance of travel of the suspended roller 78 in the direction of the arrow J during the time period T from t1 to t2, the following equation (3) is obtained.

$$V1 \cdot t1 = V4 (t2 - t1) \tag{3}$$

Since each of length of transport of the photoreceptive sheet 34 at the exposure position P1 during a time period T from t0 to t2 and length of transport of the photoreceptive sheet 34 at the image forming position P2 during the time period from t0 to t2 is expressed by (L+l), the following equations (4) and (5) are established.

$$V1 \cdot t2 = L + l \tag{4}$$

$$V1(t2 - t1) = L + l \tag{5}$$

By the above equations (1) to (5), the following relations are obtained.

$$t1 = (L+l)(V2-V1)/V1 \cdot V2$$

$$t2 = (L+l)/V1$$

$$V3 = V1/2$$

$$V4 = (V2-V1)/2$$

Therefore, if the values of L, l, V1 and V2 are determined, it becomes possible to obtain the values of t1, t2, V3 and V4. The first and second speeds V1 and V2 are determined according to the kind of the photoreceptive sheet 34, while the distance l is determined based on the image forming apparatus in use. Furthermore, the length L of the image area 34a represents the size of the image to be formed and is inputted by the operational keys at the time of image formation.

For example, in the case where an A4-sized image having the length L of 296 mm is formed by employing the photoreceptive sheet 34 having the first speed V1 of 4.5 mm/sec. and the second speed V2 of 40 mm/sec. and the image forming apparatus having the distance l of 100 mm (distance between P1 and P2=80 mm, α=20 mm), the following values are obtained.

$t1 = 78.1$ sec.

$t2 = 88$ sec.

$V3 = 20$ mm/sec.

$V4 = 17.75$ mm/sec.

Meanwhile, in this example, the length α is set to 20 mm. However, the length α can be set to such values as to feed the rear end 34a-2 of the image area 34a (rear end of the image receiving sheet 46) to a location slightly downstream of the image forming position P2 and may range from 15 to 30 mm approximately. If the length α is set as described above, the image receiving sheet 46 placed on the image area 34a is fed completely downstream of the image forming position P2, so that a phenomenon can be eliminated whereby the image receiving sheet 46 is gripped between the upper and lower pressure rollers 32 and 33 at the time of completion of image formation.

Figure 12:
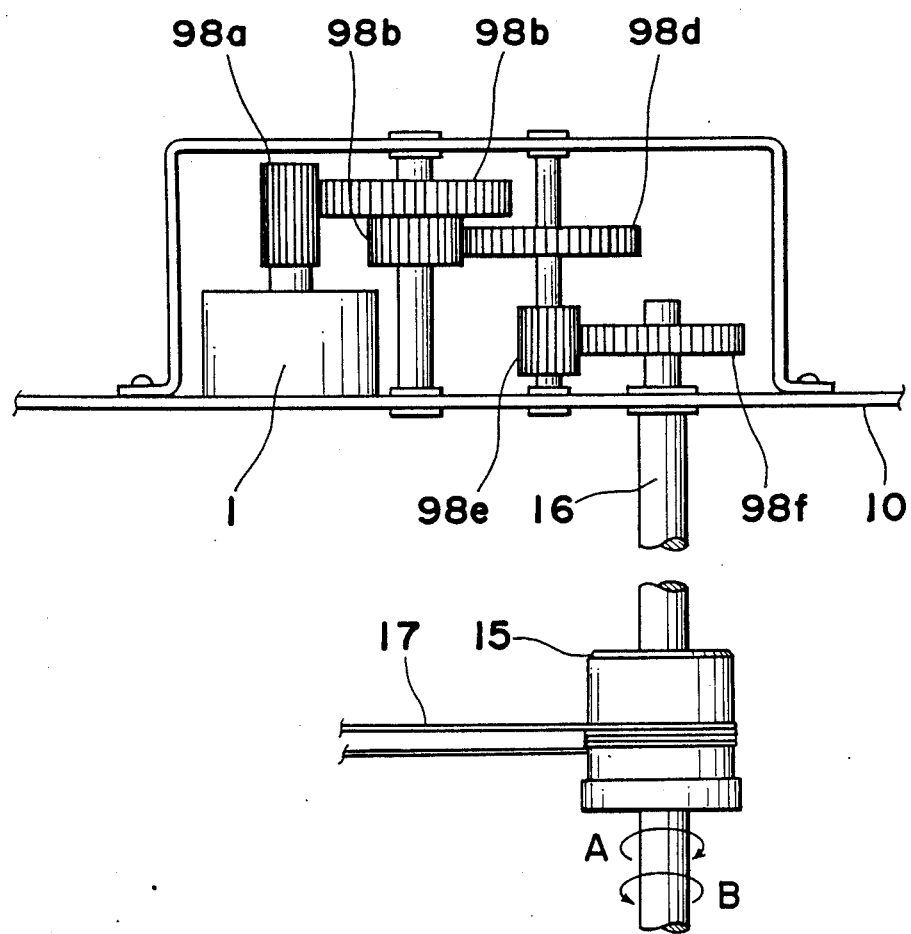
FIG. 12 is a view similar to FIG. 5, particularly showing the second embodiment of the present invention.

FIG. 12 shows a drive mechanism for driving the suspended roller 78, employed in the image forming apparatus to which the method according to the second embodiment of the present invention may be applied. In FIG. 12, rotation of the motor 1 is transmitted to the shaft 16 through gears 98a to 98f. Rotational direction and rotational speed of the shaft 16 are determined by rotational direction and rotational speed of the motor 1. When the shaft 16 is rotated in the direction of the arrow A upon rotation of the motor 1, the guide 11 is displaced in the direction of the arrow I. Meanwhile, when the shaft 16 is rotated in the direction of the arrow J upon rotation of the motor 1, the guide 11 is displaced in the direction of the arrow J. When the guide 11 is displaced in the direction of the arrow I, the suspended roller 78 supported by the guide 11 is also displaced in the direction of the arrow I. On the other hand, when the guide 11 is displaced in the direction of the arrow J, the suspended roller 78 is also displaced in the direction of the arrow J. Feed rate of the suspended roller 78 in the direction of the arrow I or J is determined by rotational speed of the motor 1.

Figure 10A:
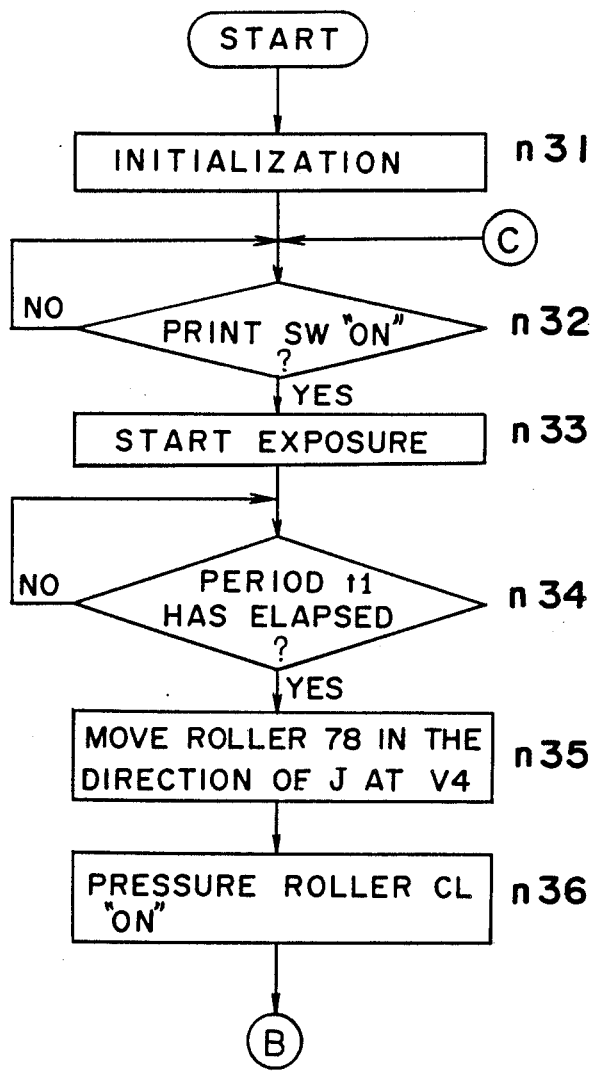
FIGS. 10a and 10b are flow charts showing a processing sequence of a copying operation of the image forming apparatus of FIG. 3 in the method of FIGS. 9a to 9d.
Figure 10B:
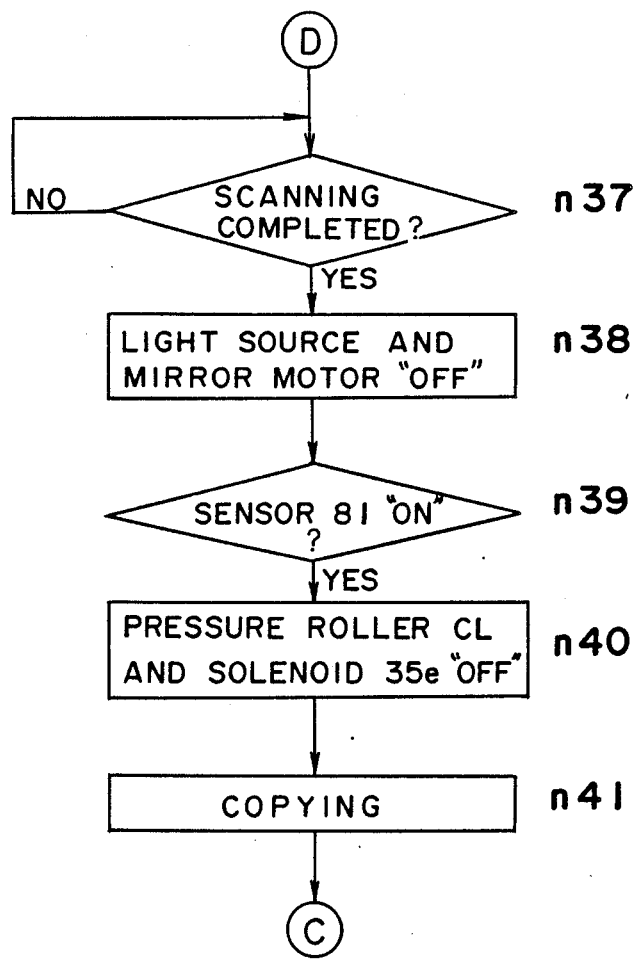
Figure 11:
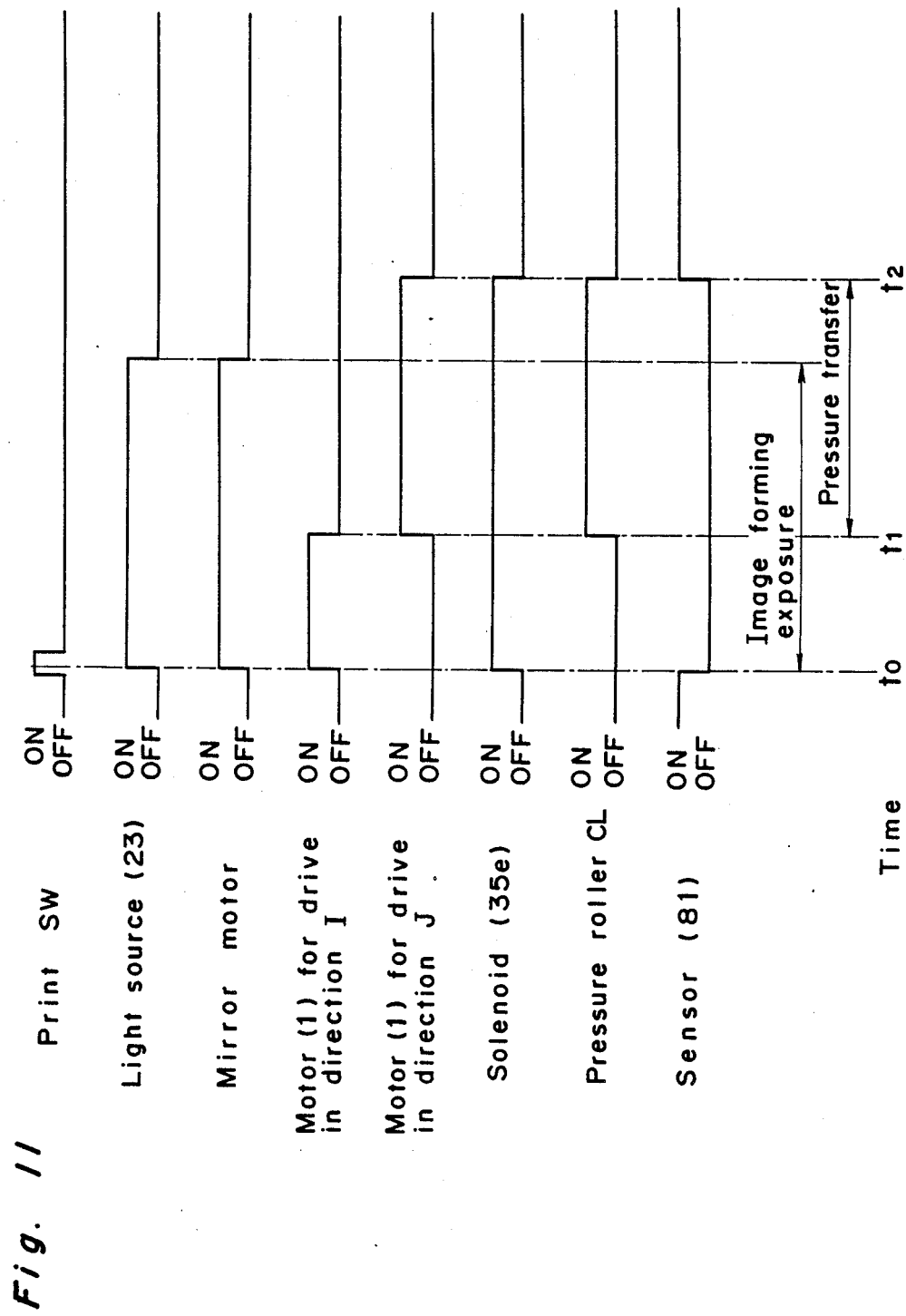
FIG. 11 is a timing chart of the copying operation of FIGS. 10a and 10b.

FIGS. 10a and 10b are flow charts showing a processing sequence of a copying operation of the image forming apparatus of FIG. 3 in the method according to the second embodiment of the present invention. FIG. 11 is a timing chart of the various motors the solenoid 35e in the copying operation. When the power source of the image forming apparatus has been turned on, initialization such as operational checkup of the various devices and heating of the heat roller 55 is performed at step n31. Then, it is found at step n32 that a print switch (not shown) provided on the apparatus housing 21 is in an ON state, image forming exposure is started at step n33 so as to start the copying operation. At step n33, (a) the light source 23 is turned on, (b) a mirror motor (not shown) for driving the mirrors 24 to 26 is driven so as to displace the mirrors 24 to 26 in the direction of the arrow G in FIG. 3 such that scanning of the original document is performed, (c) the solenoid 35e for the supply shaft 35 is turned on so as to cancel locking of the supply shaft 35 and (d) the motor 1 is turned on so as to displace the suspended roller 78 in the direction of the arrow I in FIG. 3. At this time, the rotational speed of the motor 1 is set such that feed rate of the suspended roller 78 in the direction of the arrow I assumes V3 (=V1/2). Steps n31 to n33 correspond to the first step of claim 4.

At step n34, upon lapse of the predetermined time period t1 after start of travel of the suspended roller 78 (after start of image forming exposure), pressure transfer is started simultaneously with exposure. Namely, at step n35, the motor 1 is rotated in the opposite direction so as to displace the suspended roller 78 in the direction of the arrow J at the speed V4 (=(V2−V1)/2). Then, at step n36, the clutch for the upper pressure roller 32 is turned on so as to rotate the upper and lower pressure rollers 32 and 33, while the image receiving sheet 46a or 46b is fed and is placed on the selectively set image of the photoreceptive sheet 34 so as to be pressed against the selectively set image. If it is found at step n37 that scanning of the original document has been completed, then the light source 23 and the mirror motor for driving the mirrors 24 to 26 are turned off at step n38 so as to finish exposure. At this time, the rear end 34a-2 of the image area 34a of the photoreceptive sheet 34 is disposed just at the exposure position P1. Thus, transport of the photoreceptive sheet 34 is continued until the rear end 34a-2 of the image area 34a reaches a location spaced downstream the length a from the image forming position P2. At step n39, a decision is made as to whether or not the sensor 81 is in the ON state. Turning on of the sensor 81 means that the photoreceptive sheet 34 has been transported through a distance of (L+l) from the time point t0 of start of exposure. Hence, in the case of "YES" at step n39, the program flow proceeds to step n40 at which the motor 1 is turned off, the clutch for the upper pressure roller 32 is turned off so as to stop transport of the photoreceptive sheet 34 and the solenoid 35e for the supply shaft 35 is turned off so as to lock the supply shaft 35. Steps n34 to n40 correspond to the second step of claim 4. Then, copying processing such as heating of the image receiving sheet 46a or 46b is performed at step n41 and thus, the copying operation is completed.

In the method according to the second embodiment of the present invention, the same effect as that of the first embodiment of the present invention can be achieved. Furthermore, in the second embodiment of the present invention, since image forming exposure and pressure transfer can be performed simultaneously while exposure speed and image forming speed are separately set, time period required for forming the image can be reduced.

Figure 13A:
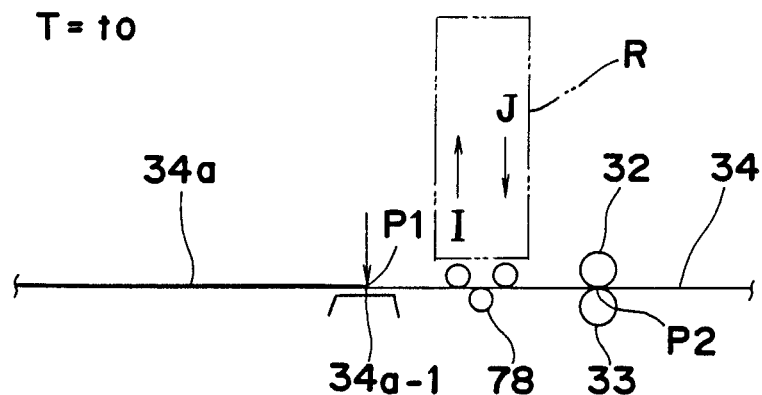
FIGS. 13a to 13e are views similar to FIGS. 9a to 9d, particularly showing a third embodiment of the present invention.
Figure 13B:
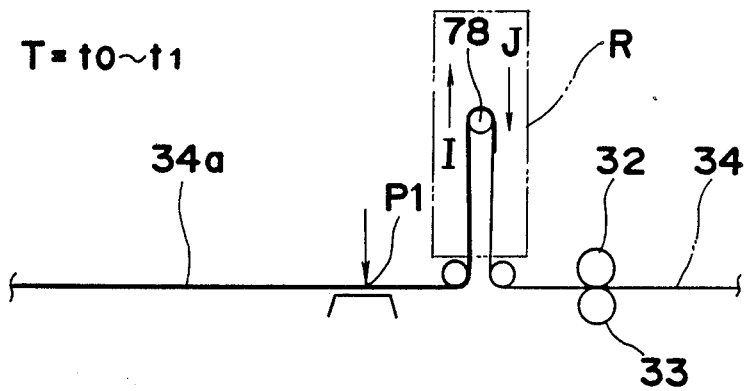
Figure 13C:
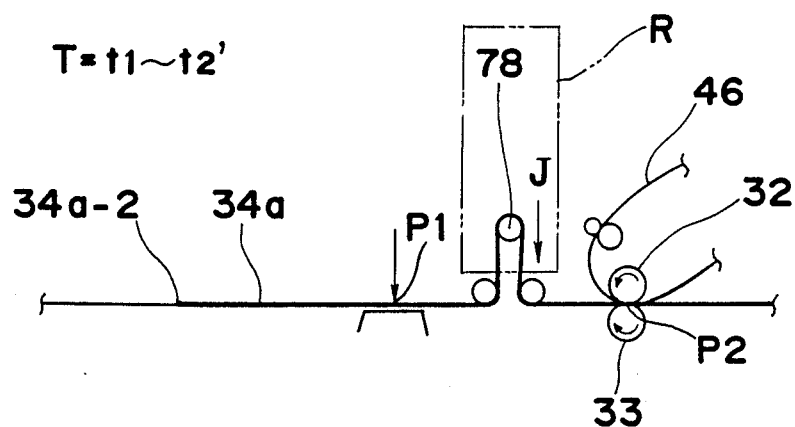

FIGS. 13a to 13e show transport states of the photoreceptive sheet 34 in a method of controlling transport of the photoreceptive sheet 34, according to a third embodiment of the present invention. Since FIGS. 13a to 13c are substantially identical with FIGS. 9a to 9c, respectively, description thereof is abbreviated hereinafter.

Figure 13D:
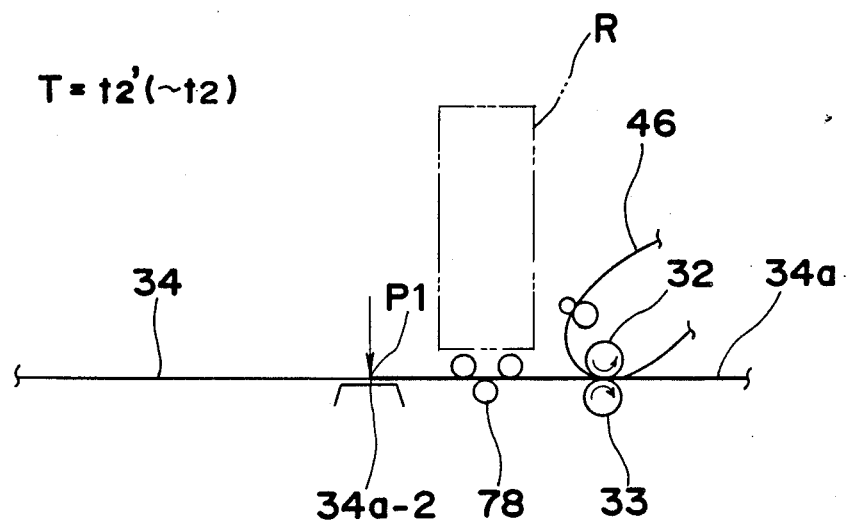
Figure 13E:
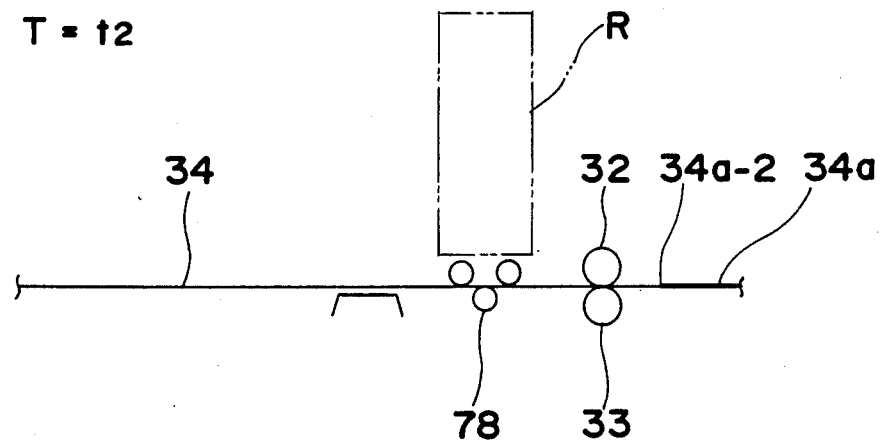

FIG. 13d shows a state in which image formation has been completed. When the suspended roller 78 has been returned to the original position (home position), exposure of the rear end 34a-2 of the image area 34a just been completed. Therefore, the exposed photoreceptive sheet 34 disposed between the exposure position P1 and the image forming position P2 is subsequently transported continuously until the rear end 34a-2 of the image area 34a is displaced to a location slightly downstream of the image forming position P2. This is because a phenomenon is prevented whereby image formation is completed in a state where the rear end of the image receiving sheet 46 is gripped between the upper and lower pressure rollers 32 and 33.

In addition to the factors V1 to V4, L, l and t0 to t2 employed in the second embodiment of the present invention, a time period t2' between the time point t0 and a time point of completion of exposure is employed in the third embodiment of the present invention.

During a time period T from t0 to t1 of FIG. 13b, since the photoreceptive sheet 34 is subjected only to exposure, the suspended roller 78 is displaced in the direction of the arrow I so as to draw the photoreceptive sheet 34 from the supply shaft 35 at the first speed V1. Thus, the following relation (11) is obtained in the same manner as in the relation (1) of FIG. 9b.

$$V3 = \tfrac{1}{2} V1 \quad (11)$$

Meanwhile, during a time period T from t1 to t2' of FIG. 13c, since the photoreceptive sheet 34 is not only subjected to exposure but is pressed against the image forming position P2, the suspended roller 78 is displaced in the direction of the arrow J such that the roll of the photoreceptive sheet 34 is drawn from the supply shaft 35 at the first speed V1 and the photoreceptive sheet 34 disposed at the buffer region R is fed to the image forming position P2 at the second speed V2. Thus, the following relation (12) is obtained in the same manner as in the relation (2) of FIG. 9c.

$$V4 = \tfrac{1}{2}(V2 - V1) \quad (12)$$

Furthermore, since the travel distance of the suspended roller 78 in the direction of the arrow I during the time period from t0 to t1 is identical with the travel distance of the suspended roller 78 in the direction of the arrow J during the time period T from t1 to t2', the following equation (13) is obtained.

$$V1 \cdot t1 = V4 (t2' - t1) \quad (13)$$

Since the length of transport of the photoreceptive sheet 34 at the exposure position P1 during the time period from t0 to t2' is expressed by L, the following equation (14) is obtained.

$$V1 \cdot t2' = L \quad (14)$$

Meanwhile, the length of transport of the photoreceptive sheet 34 at the image forming position P2 is expressed by L, and the following relation (15) is obtained.

$$V2(t2' - t1) = L \quad (15)$$

Moreover, since the length of travel of the photoreceptive sheet 34 during the time period from t1 to t2 is expressed by (L+l), the following relation (16) is established.

$$V2(t2 - t1) = L + l \quad (16)$$

By the above equations (11) to (16), the following relations are obtained.

$$t1 = (V2 - V1) \cdot L / V1 \cdot V2$$

$$t2' = L / V1$$

$$t2 = (V1 \cdot l + V2 \cdot L) / V1 \cdot V2$$

$$V3 = V1/2$$

$$V4 = (V2 - V1)/2$$

Therefore, if values of L, l, V1 and V2 are determined, it becomes possible to obtain values of t1, t2', t2, V3 and V4. For example, in the case where an A4-sized image having the length L of 296 mm is formed by employing the photoreceptive sheet 34 having the first speed V1 of 4.5 mm/sec. and the second speed V2 of 40 mm/sec. and the image forming apparatus having the distance l of 100 mm (distance between P1 and P2=80 mm, a=20 mm), the following values are obtained.

$t1 = 58.38$ sec.

$t2' = 65.78$ sec.

$t2 = 68.28$ sec.

$V3 = 20$ mm/sec.

$V4 = 17.75$ mm/sec.

Figure 14:
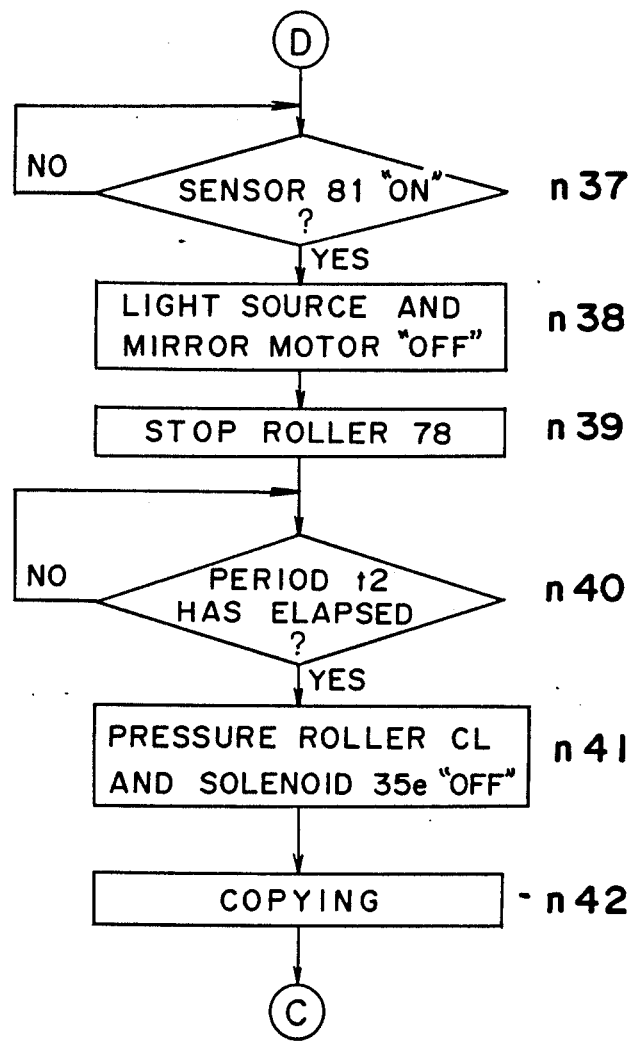
FIG. 14 is a flow chart similar to FIG. 10b, particularly showing the third embodiment of the present invention.

FIG. 14 is a flow chart showing a processing sequence of a copying operation of the image forming apparatus of FIG. 3 in the method according to the third embodiment of the present invention. FIG. 15 is a timing chart of the various motors and the solenoid 35e" in the copying operation. In the third embodiment of the present invention, it is to be noted that steps n31 to n36 of FIG. 10a are followed by steps n37 to n42 of FIG. 14. Since steps n31 to n36 of FIG. 10a have been described earlier, description thereof is abbreviated for the sake of brevity hereinafter.

If turning on of the sensor 81 is detected at step n37, it means that the predetermined exposure time period t2' has elapsed. Thus, at step n38, the light source 23 and the mirror motor for driving the mirrors 24 to 26 are turned off at step n38 so as to finish exposure. Then, at step n39, the suspended roller 78 is also stopped.

Even after exposure has been completed, pressure transfer is continuously performed until the photoreceptive sheet is fed through the distance l. At steps n40 and n41, pressure transfer is stopped by turning off the clutch for the upper pressure roller 32 and the solenoid 35e for the supply shaft 35 upon lapse of the time period t2, i.e. at the time when the rear end 34a-2 of the image area 34a is disposed at a location spaced downstream about 20 mm from the image forming position P2. Subsequently, copying processing such as heating of the image receiving sheet 46a or 46b is performed at step n42 and thus, the copying operation is completed.

In the method according to the third embodiment of the present invention, the same effects as those of the second embodiment of the present invention can be obtained.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as being included therein.

What is claimed is:

1. A method for controlling transport of a photreceptive sheet, comprising the steps of:
    feeding the photorecptive sheet from a roll of the photoreceptive sheet to an exposure position so as to subject the photoreceptive sheet to image forming exposure at a first speed;
    transporting the exposed photoreceptive sheet to a buffer region, said buffer region including an independent suspension member;
    tensioning said photoreceptive sheet in said buffer region with said independent suspension member;
    transporting the photoreceptive sheet disposed at the buffer region to an image forming position; and
    feeding the photoreceptive sheet disposed between the exposure position and the image forming position to the image forming position at a second speed, wherein said suspension member in said buffer region controls the first speed of the photoreceptive sheet at the exposure position.

2. A method for controlling transport of a photoreceptive sheet, comprising the steps of:
    feeding the photoreceptive sheet from a roll of the photoreceptive sheet to an exposure position so as to subject the photoreceptive sheet to image forming exposure;
    transporting the exposed photoreceptive sheet to a buffer region, said buffer region including an independent suspension member;
    tensioning said photoreceptive sheet in said buffer region with said independence suspension member;
    transporting the photoreceptive sheet disposed at the exposure position to the buffer region; and
    transporting the photoreceptive sheet disposed at the buffer region to an image forming position.

3. A method as claimed in claim 1 or 2, wherein when the photoreceptive sheet disposed in the buffer region is transported to the image forming position, a supply shaft for the roll of the photoreceptive sheet is locked.

4. A method for controlling transport of a photoreceptive sheet, comprising of steps of:
    transporting the photoreceptive sheet from a roll of the photoreceptive sheet to a buffer region at a first speed corresponding to an exposure speed of the photoreceptive sheet;
    tensioning the photoreceptive sheet in the buffer region; and
    transporting the photoreceptive sheet from the buffer region to an image forming position at a second speed corresponding to an image forming speed of the photoreceptive sheet.

5. A method for controlling transport of a photosensitive sheet, comprising the step of:
    transporting the photoreceptive sheet from a roll of the photoreceptive sheet to a buffer region at a first speed corresponding to an exposure speed of the photoreceptive sheet, said transport at the first speed being upon lapse of a predetermined time period from start of exposure;
    tensioning the photoreceptive sheet in the buffer region;
    transporting the photoreceptive sheet disposed at the buffer region to an image forming position at a second speed corresponding to an image forming speed of the photoreceptive sheet; and
    transporting the photoreceptive sheet to the image forming position at the second speed after completion of exposure.

6. A method as claimed in claim 1, wherein said indepentdent suspension member reduces space requirements of said buffer region and prevents scraping of essential materials from said photoreceptive sheet.

* * * * *